INVENTOR
HANS-JÜRGEN BOBZIN
BY
Frank R. Jifani
AGENT

INVENTOR
HANS-JÜRGEN BOBZIN
BY
Frank R. Jufani
AGENT

United States Patent Office 3,263,181
Patented July 26, 1966

3,263,181

CIRCUIT FOR ADJUSTING VOLUME AND COMPRESSION OF A SIGNAL

Hans-Jürgen Bobzin, Hamburg, Germany, assignor to North American Philips Company, Inc., New York, N.Y., a corporation of Delaware Filed June 28, 1962, Ser. No. 206,047
Claims priority, application Germany, July 10, 1961, P 27,506
6 Claims. (Cl. 330—130)

Figure 1:
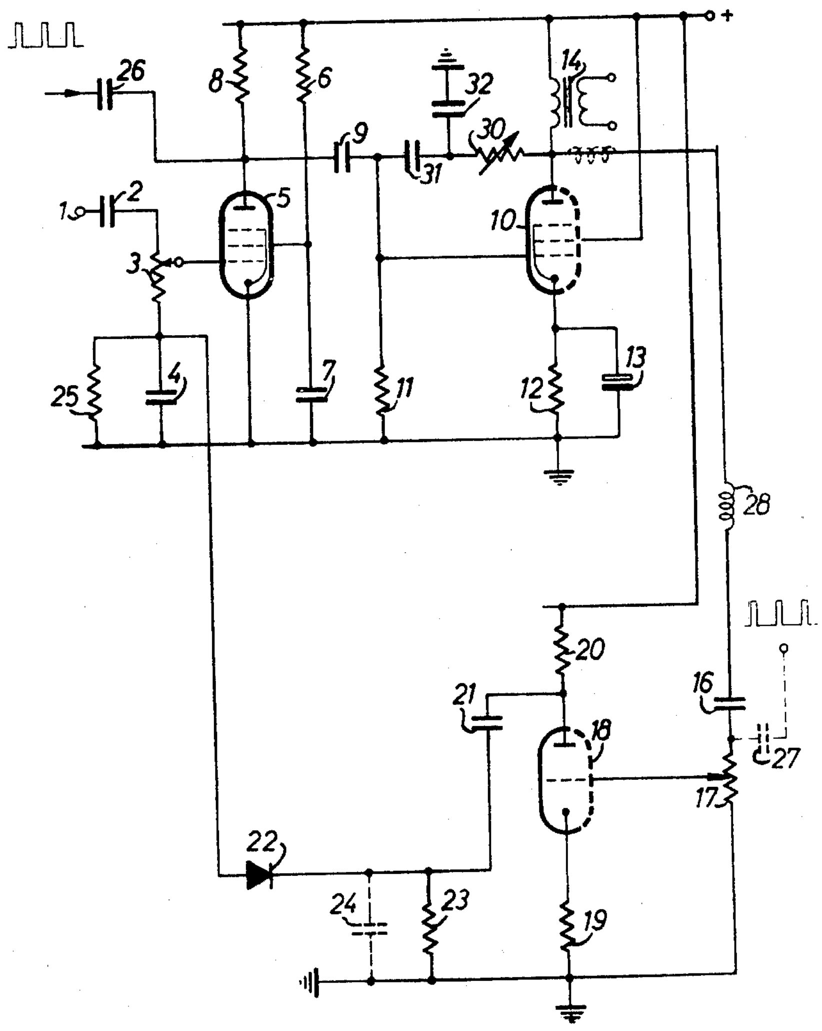

The invention relates to a circuit for adjusting volume and compression, in particular of an audio signal, in which the signal is supplied to the output circuit by way of a controllable, amplifying element and wherein the control voltage for the amplifying element is obtained by rectification of oscillations from the output circuit.

Such a circuit arrangement is of particular importance in television receivers, for it has been found that in television broadcasting satisfactory intelligibility of speech usually requires a materially higher volume than in purely acoustic broadcasts. This may be due to the fact that the capacity of the viewers to respond to acoustic signals is reduced if images (optical signals) are simultaneously attentively observed. The viewers may be influenced by the emission of oscillations at line-frequency. Variation of the minimum volume to a higher level results in a correspondingly increased volume of the acoustic signals transmitted with higher amplitude. This effect frequently occurs in transition of the signals from speech to music.

These volume differences may be compensated in known manner by volume compression. With the aid of such a circuit arrangement it is usually achieved that with increased volume of the original signal the amplification is reduced by the control voltage so that the volume of the output signal is increased in an appreciably smaller degree. If the degree of the volume compression is adjustable it is found that the average volume is also reduced with increasing volume compression, particularly because by suitable proportioning of the circuit arrangement and adjustment of the input amplitude the arrangement preferably is designed so that the signals at the lowest volume level to be expected corresponds to the minimum volume of reproduction desired in view of the ambient noise or intelligibility. Hence adjustment of the volume as perceived by the listener is also obtainable in practice by adjustment of the degree of volume compression.

Normally, however, the minimum volume produced cannot be influenced by such means.

The invention deals with the problem of providing a circuit for the adjustment of volume compression such that by means of the control member enabling the degree of the volume compression to be adjusted, the output signal strength may also be reduced at least substantially to zero. This is of particular importance with respect to television receivers in which volume compression is highly desirable. Since the control members are frequently designed as remote-control members, the combining of the compression and minimum volume controls results in considerable saving.

In a circuit arrangement for adjustable volume contrast control, particularly of an audio signal, in which the useful signal is supplied to the output circuit by way of a controllable amplifying element and in which the control voltage for the amplifying element is obtained by rectification of output circuit oscillations, this is achieved in accordance with the invention by connecting an adjustable voltage divider between the useful signal output and the rectifier and by supplying an auxiliary signal, which preferably is situated outside the useful frequency range, together with the signal oscillations to the control channel at a point following the control stage.

Figure 2:
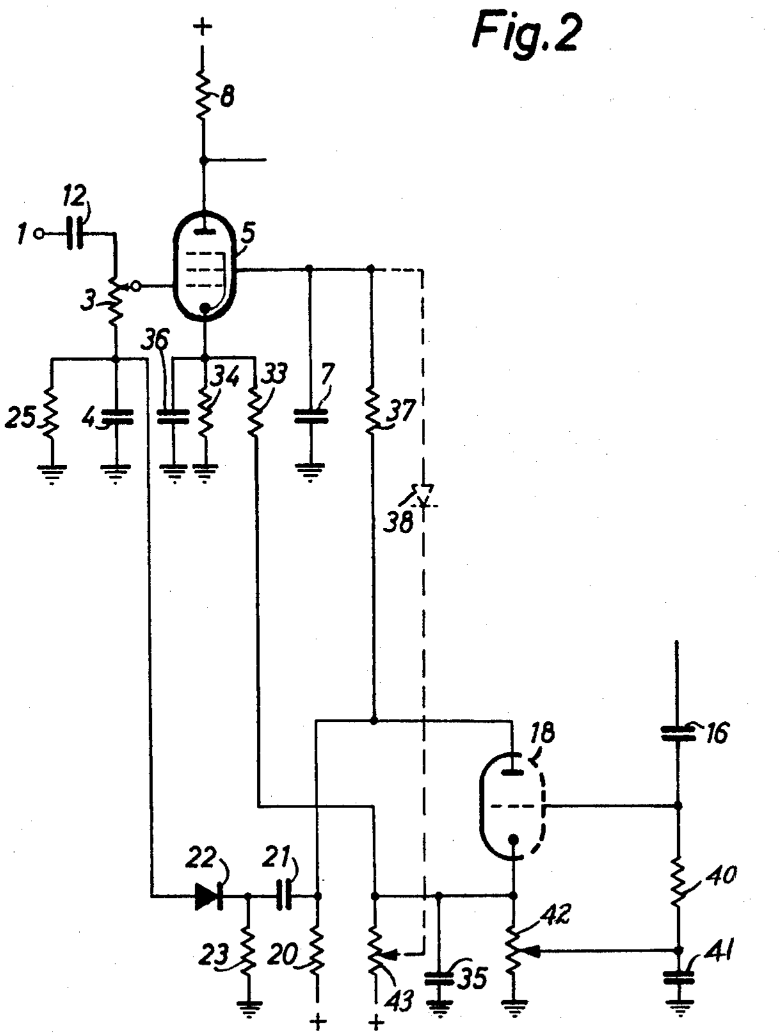

In order that the invention may be more clearly understood, embodiments thereof will now be described, by way of example, with reference to the accompanying diagrammatic drawings, in which:

FIG. 1 is a circuit diagram of an embodiment in which an alternating current auxiliary signal is used, and FIG. 2 is a circuit diagram of a modified arrangement in which a direct-current auxiliary signal is used.

In FIG. 1 the audio signals received from an audio demodulator, not shown, are supplied by way of a terminal 1 and a coupling capacitor 2 to a potentiometer 3 of, for example, 1 megohm. The other end of this potentiometer is connected to ground by way of a capacitor 4 of, for example, 1 $\mu$f. The adjustable tap on the potentiometer 3 is connected to the control grid of an amplifying tube 5. The cathode of this tube is grounded and its screen grid is connected through a resistor 6 of, for example, 560K ohms to the positive terminal of the voltage supply source of, for example 200 v. The screen grid is connected to ground by way of a capacitor 7 of, for example, 56 nf. The anode of the tube 5 is connected through a load resistor 8 of, for example, 120K ohms to the positive terminal of the voltage supply source and through a blocking capacitor 9 of, for example, 47 nf. to the control grid of an audio output tube 10. The control grid of tube 10 is also connected to ground through a resistor 11 of, for example, 1 megohm. The cathode circuit of the tube 10 includes a resistor 12 of, for example, 390 ohms, shunted by a capacitor 13 of, for example, 50 mf. The screen grid of the tube 10 is connected directly to the positive terminal of the voltage supply source. An output transformer 14 is connected in the anode circuit of the said tube. The secondary winding of the transformer may be connected to a loudspeaker or loudspeakers.

The oscillations produced at the anode of the output tube 10 are supplied by way of a blocking capacitor 16 of, for example, 10 nf. to an adjustable potentiometer 17, of, for example, 1 megohm. The other end of the potentiometer is connected to ground. The slider of the potentiometer 17 is connected to the control grid of control amplifying tube 18. The cathode circuit of tube 18 includes a resistor 19 of, say, 3.9K ohms which may be shunted by a capacitor. The tubes 10 and 18 may be a multiple section tube, for example of the type PCL 82 or ECL 82.

A load resistor 20 of, for example, 220K ohms is connected between the anode of the tube 18 and the positive terminal of the voltage supply source. The amplified oscillations produced at the anode of the tube 18 are supplied by way of a blocking capacitor 21 of, for example, 18 nf. to the cathode of a semi-conductor rectifier 22, for example of the type OA 202. The anode of the rectifier is connected to the ungrounded electrode of the capacitor 4. The cathode of the diode 22 is connected to ground by way of a resistor 23 of, for example, 1 megohm. The resistor 23 may be shunted by a capacitor 24 of, for example, 500 pf. To enable the capacitor 4 to discharge, it is shunted by a resistor 25 of, for example, 50 megohms. This resistor may be omitted if the resistance of the diode 22 in the reverse direction has a suitable value.

The audio signal oscillations supplied by the demodulator are reduced to an amplitude in which there is no likelihood of distortion in the following control tube 5 by means of potentiometer 3. The control tube 5 may be of the type PF 86 or EF 86. It is true that these tubes are not variable-mu tubes of the kind generally used in high-frequency amplification where extraordinarily large signal variations have to be coped with. Moreover, the volume compression of an audio signal, however, is considerably smaller than a high frequency signal, so that the control range may be comparatively small. On the other hand usually only one control stage is available and the amplitude of the control direct voltage varies only within a limited range. It has been found that a tube having a comparatively high maximum mutual conductance and a comparatively marked knee is suitable as a control tube for this purpose provided that the input amplitude is maintained small enough. This may be effected with the aid of the potentiometer 3. The oscillations amplified in the tube 5 are applied to the output tube and, by way of the output transformer 14, to the loudspeaker or loudspeakers.

The audio oscillations produced at the output impedance (transformer 14) are supplied by way of the potentiometer 17 to the auxiliary amplifying tube 18. These oscillations are rectified by the diode 22 so that, particularly with strong signals, a control voltage is produced across the capacitor 4 which negatively biases the grid of the tube 5. As a result, the gain of tube 5 and hence the amplitude of loud parts of the program are reduced. The adjustment of the potentiometer 17 enables the degree of the volume compression to be varied. When the slider is at the lower end no audio signal voltages are applied to the tube 18 and hence to the diode 22 so that the volume compression of the input signal is not changed. The further the slider is moved upwards along the potentiometer 17, the greater is the influence exerted on large amplitudes of the input signal and hence the larger is the resulting volume compression.

According to the invention an auxiliary signal, which preferably is situated outside the useful frequency-range of the signal, is added to the control signal at a point following the control stage. In the embodiment shown in FIGURE 1 this is effected by applying the pulses produced by the line deflection device (in a television receiver) to the anode of the tube 5 through a coupling capacitor 26. The auxiliary oscillations have so small an amplitude that their presence cannot cause overdriving and consequent distortion. The frequency is above the audio-frequency range to be reproduced. The auxiliary oscillations are also amplified in the tubes 10 and 18 and are applied to the rectifier 22. Their amplitude is such that when the slider of the potentiometer 17 is at the upper end, the amplitude of the auxiliary oscillations applied to the tube 18 is so large that, with the aid of the rectifier 22, a control voltage is obtained by which the gain of the control stage including the tube 5 is reduced at least approximately to zero. This has the following effect.

When the slider of the potentiometer 17 is at the lower end, both the signal oscillation and the auxiliary oscillations have zero amplitude at the grid of the tube 18 so that no control voltage and hence no volume compression are produced. When the slider is moved upwards the signal amplitude is increased. Since, in this condition, the control stage including the tube 5 provides at least approximately maximum gain, the amplitude of the signal appearing at the output impedance 14 and hence at the tube 18 also is materially larger than the amplitude of the auxiliary oscillations, so that volume compression only is obtained. If the slider of the potentiometer 17 is moved further upwards, even with small input signals a comparatively large control voltage is produced by which the gain of the tube 5 is decreased. In this case the auxiliary oscillations, the amplitude of which remains unchanged at the output impedance 14 and hence at the potentiometer 17, have a large amplitude at the grid of the tube 18, however, they are still small compared with the signal oscillations. When the slider of the potentiometer 17, is moved upwards again, a considerable part of the control voltage is determined by the auxiliary oscillations so that in this respect the gain of the tube 5 is reduced more or less independently of the amplitude of the audio signals. When the slider is at the uppermost end of the potentiometer 17, the auxiliary oscillations alone produce a voltage such as to provide a control direct voltage which substantially cuts off the control stage. Thus the audio signals are substantially suppressed.

Consequently the desired effect is achieved, i.e. when the potentiometer 17 is operated, an increasing volume compression and subsequently a reduction of the volume to zero are obtained.

As is known, in a television-receiver the oscillations at line-frequency have a large amplitude so that it is usually necessary to protect the other parts of the receiver by careful shielding. In contra-distinction thereto in a circuit arrangement according to the invention an auxiliary oscillation at line frequency is desired. Hence the auxiliary oscillation need not be supplied through a coupling capacitor 26 but may be provided by incomplete shielding.

Since it is desired for the amplitude of the auxiliary signals to increase with variation of the potentiometer 17, the auxiliary signals need not pass through the part of the amplifying circuit preceding the signal output. Consequently, the auxiliary oscillations may alternatively be directly applied to the potentiometer 17 by way of a blocking capacitor 27. In this case a rejection circuit for the auxiliary oscillations, for example, a choke 28, may, if desired, be connected between the supply point and the signal output.

For adjustment of the tone a negative feedback circuit may be included comprising, for example, the series combination of a variable resistor 30 of, for example, 500K ohms and a capacitor 31 of, for example, 1 nf. connected between the anode and the grid of the tube 10. The junction point of the resistor 30 and the capacitor 31 is grounded by way of a parallel capacitor 32 of, say 1 nf. It may be desirable to apply negative feed back to an input electrode of the tube 5, for example, to the grid of the cathode, to compensate for distortion which may be produced in the tube 5.

The problem underlying the invention may also be solved by using a direct-current quantity instead of an alternating voltage or an alternating current as the auxiliary signal. For this purpose the potentiometer 17 may be separated with respect to direct current by a capacitor preceding the grid of the tube 18 and it may have a direct voltage applied to it such as to produce a variable direct voltage at the slider. This variable direct voltage may be applied, for example as bias voltage to the diode 22 or directly, to the grid of the tube 5, suitable proportioning again providing the effect that by moving the slider along the lower part of the potentiometer 17 a variation of the volume compression is obtainable while by moving it towards the upper end a reduction of the minimum volume and finally a complete suppression of the signal transmission may be achieved. It may be of advantage to include a threshold value circuit in the channel for the auxiliary signal, for example with the aid of a biased diode following the slider of the potentiometer 17.

The potentiometer 17 may obviously be replaced by another device producing a similar effect, for example, by the series combination of a fixed resistor and a variable resistor. The desired variation of the output signal of the auxiliary amplifying stage may also be obtained by varying the amplification of the tube 18 with the aid of a variable bias voltage. An example of such an arrangement is given in FIG. 2 which shows the parts of the circuit arrangement of FIG. 1 which have been changed for this purpose.

In the circuit arrangement shown in FIG. 2 the demodulated low-frequency oscillations are applied in the same manner to the tube 5 and from the anode thereof control the output stage 10 (not shown). The output signal of the output stage is applied by way of the capacitor 16 to the grid of the tube 18. No voltage divider for the alternating voltages is connected to this grid but it is grounded by way of series connected resistor 40 of, for example, 1 megohm and capacitor 41 of, for example, 1 μf. A voltage divider comprising resistors 42 and 43 is connected between the positive terminal of the voltage supply source and ground. The cathode of the auxiliary amplifier tube 18 is connected to the tap of the voltage divider. Tube 18 is preferably of the variable mu type. The grid leak resistor 40 is connected to the adjustable slider of resistor 42. Hence, movement of this slider enables the grid bias of the tube 18 and hence its gain to be changed. The voltage divider 42, 43 is dimensioned so that when the slider is at the end of the resistor 32 connected to ground the variable mu amplifier tube 18 is substantially cut off.

The cathode voltage of the tube 18 is applied through a voltage divider comprising resistors 33 and 34 to the cathode of the tube 5. This voltage divider is adjusted so as to set the operating point of the tube 5 to the value required for volume compression in normal operation. The shunt currents of the voltage divider are given values such that variations of the cathode currents of the tubes 5 and 18 have susbtantially no disturbing influence on the adjusted bias voltages. If other amplifying elements should be used requiring a higher (positive) bias voltage to be applied to the control stage than to the auxiliary amplifier stage, with corresponding proportioning of the resistance values, the resistor 43 would have to be connected to the junction of the resistors 33 and 34 or to another point of the circuit arrangement. To avoid alternating-current negative feedback the resistors 42 and 34 are shunted by capacitors 35 and 36, respectively, which preferably are of the order of magnitude of from 10 to 100 microfarads.

The output alternating voltage of the tube 18 is rectified by the diode 22 and the rectified voltage is applied to the tube 5 to provide volume compression control, as in the circuit of FIG. 1. By shifting the slider on the resistor 42 the gain of the tube 18 and hence the degree of volume compression is varied. Due to the voltage drop across the resistor 20, this voltage drop being proportional to the anode current, the anode voltage of the tube 18 is also varied in a manner such that the anode voltage decreases with increase in the volume compression. The anode of the tube 18 is connected for direct current to the screen grid of the tube 15 by way of a resistor 37. If now with increased volume compression the anode voltage of the tube 18 has dropped appreciably, the screen grid voltage of the tube 5 is also appreciably reduced, and the values employed together with the bias voltage applied through the cathode resistor 34 are chosen so that the tube 5 is cut off.

Thus in this circuit also variation of the adjustment of the control member 42 first produces increase in volume compression and finally a reduction of the sound volume to zero. The control voltage for the volume compression and the control voltage for cutting off the tube 5, however, are applied to different electrodes.

Since in a tube variation in the mutual conductance is greatest at low values of the anode current (near the knee of the characteristic) whereas on further decrease of the negative grid bias the mutual conductance is finally substantially constant but the anode current is greatly increased, in the circuit arrangement shown in FIG. 2 beyond a certain setting of the slider on the potentiometer 32 the volume compression no longer changes but the anode current, and hence the anode voltage, are greatly influenced.

If in the range in which a variation of the volume compression is required stabilisation of the operating point of the tube 5, in particular its screen grid voltage, is desired, a rectifier 38 may be connected between the screen grid and a tap on the resistor 43. This enables the screen grid voltage of the tube 5 to be maintained at a low value of, for example, 100 v., whereas the anode voltage of the tube 18 falls off from approximately the full value of the battery voltage of, say, 200 v. to 100 v. Only on further increase of the current and a resulting voltage drop across the resistor 20 the voltage variation of the anode of the tube 18 is applied to the screen grid of the tube 5.

Obviously a circuit in accordance with the invention may comprise amplifier elements of another kind, for example, transistors.

An adjustment of the volume, in particular of the loudness of the reproduction of programs transmitted at a low signal level, may be effected in a circuit in accordance with the invention with the aid of the control potentiometer 3 or at any other point of the useful signal channel. It should, however, be taken into consideration that this may influence the auxiliary signal and hence the adjustment for complete suppression of the useful signal. Consequently, any additional adjustment of the useful signal amplitude is preferably performed outside the part of the circuit arrangement transmitting the auxiliary signal, such as, for example, at a point preceding the anode of the tube 5 or in the loudspeaker circuit.

When audio signals are transmitted, the charge time constant of the control voltage across the capacitor 4 should be approximately from 0.05 second to 0.4 second, preferably 0.2 second, and the discharge time constant should be approximately from 3 to 30 seconds, preferably from 7 to 15 seconds.

The principle of combining increase in the volume compression and decrease of the volume to zero in accordance with the invention may, in principle, also be put into effect by coupling two separate control members, for example, the potentiometers 3 and 17 of FIG. 1. However, in many cases the solutions described hereinbefore involve less expenditure and are more suitable for remote control.

What is claimed is:

1. A system for the control of amplitude and compression of a signal with a single potentiometer, comprising a source of signals to be controlled, an amplifier stage having an input circuit, an output circuit, and control terminal means, whereby the amplification of said amplifier stage is dependent upon potential at said control terminal means, means applying said signals to said input circuit, a source of alternating voltage having substantially no frequency components within the frequency range of said signal and having an amplitude independent of said amplifier stage, a potentiometer, means connecting one end of said potentiometer to a point of reference potential, means applying said alternating voltage and the output signals of said amplifier stage to the other end of said potentiometer, rectifier means, means connecting the movable arm of said potentiometer means to said rectifier means, and means connecting said rectifier means to said control terminal means, whereby the volume compression and amplitude of signals are simultaneously varied in said amplifier stage by said potentiometer means.

2. The system of claim 1, in which said alternating voltage has sufficient amplitude that said amplifier stage is cut off when the arm of said potentiometer means is at one end thereof.

3. A system for the control of amplitude and compression of a signal with a single potentiometer, comprising a source of signals to be controlled, an amplifier stage having an input circuit, an output circuit, and control terminal means, whereby the amplification of said amplifier stage is dependent upon potential at said control terminal means, means applying said signals to said input circuit, a source of a direct voltage, an amplifier device having input, common and control electrodes, means applying the output signals from said amplifier stage to said control electrode, a voltage divider comprising a resistor and a potentiometer serially connected to said source of direct voltage, means connecting the junction of said resistor and potentiometer to said common electrode, direct current conductive means connecting the arm of said potentiometer to said control electrode to vary the amplification of said amplifier device, and means for connecting the output electrode of said amplifier device to said control terminal means, whereby the volume compression and amplification of said signals are simultaneously controlled by said potentiometer.

4. The system of claim 3, in which said means connecting the output electrode of said amplifier device to said control terminal means comprises rectifier means.

5. A system for the control of amplitude and volume compression of a signal with a single potentiometer, comprising a source of signals to be controlled, a first amplifier device having input, common, and output electrodes, input circuit means applying said signals between said input and common electrodes, said input circuit means having a control terminal for applying a control voltage whereby the amplification of said device is dependent upon a control voltage applied to said terminal, a source of an alternating potential having an amplitude independent of said first device and having substantially no frequency components within the frequency range of said signals, a potentiometer, means connecting one end of said potentiometer to a point of reference potential, means applying said potential to the other end of said potentiometer, means connecting said output electrode to said other end of said potentiometer, rectifier means, and means connecting said rectifier means between the arm of said potentiometer and said control terminal.

6. A system for the control of amplitude and volume compression of a signal with a single potentiometer, comprising a source of signals to be controlled, an electron discharge device having a cathode, first and second control electrodes, and an anode, in that order, input circuit means for applying said signals between said first control electrode and said cathode, said input circuit means having a control terminal whereby the amplification of said discharge device is dependent upon the amplitude of voltage applied to said control terminal, an amplifier device having input, common and output electrodes, a source of direct voltage, a voltage divider comprising a resistor and a potentiometer connected serially to said source of direct voltage, means connecting said common electrode to the junction of said resistor and potentiometer, resistive means connecting the arm of said potentiometer to said control electrode to control the gain of said device, means connecting said anode to said input electrode, rectifier means connecting said output electrode to said control terminal, capacitor by-pass means connected between said second control electrode and a point of reference potential, and resistor means connecting said output electrode to said second control electrode.

References Cited by the Examiner

UNITED STATES PATENTS

| | | | |
|---|---|---|---|
| 2,144,304 | 1/1939 | Barden | 325—410 |
| 2,529,428 | 11/1950 | Spielman | 330—130 |
| 2,591,637 | 4/1952 | Tilley | 330—130 |
| 2,982,919 | 5/1961 | Montgomery | 330—139 X |
| 3,015,782 | 1/1962 | Phil | 330—140 X |
| 3,048,817 | 7/1962 | Greening | 330—140 X |
| 3,087,120 | 4/1963 | Schoellhorn et al. | 330—130 |

FOREIGN PATENTS

| | | |
|---|---|---|
| 421,516 | 12/1934 | Great Britain. |

ROY LAKE, *Primary Examiner.*

ARTHUR GAUSS, *Examiner.*

N. KAUFMAN, B. P. DAVIS, *Assistant Examiners.*